(12) United States Patent
Jylhä et al.

(10) Patent No.: US 8,780,314 B2
(45) Date of Patent: Jul. 15, 2014

(54) STRENGTHENED STRUCTURAL MODULE AND METHOD OF FABRICATION

(75) Inventors: Olli Jylhä, Espoo (FI); Matti Putkonen, Espoo (FI); Arto Pakkala, Vantaa (FI)

(73) Assignee: Beneq Oy, Vantaa (FI)

(*) Notice: Subject to any disclaimer, the term of this patent is extended or adjusted under 35 U.S.C. 154(b) by 66 days.

(21) Appl. No.: 13/576,590

(22) PCT Filed: Jan. 31, 2011

(86) PCT No.: PCT/FI2011/050073
§ 371 (c)(1),
(2), (4) Date: Aug. 1, 2012

(87) PCT Pub. No.: WO2011/095681
PCT Pub. Date: Aug. 11, 2011

(65) Prior Publication Data
US 2012/0307193 A1   Dec. 6, 2012

(30) Foreign Application Priority Data
Feb. 2, 2010   (FI) ...................................... 20105096

(51) Int. Cl.
*G02F 1/1333* (2006.01)

(52) U.S. Cl.
USPC ......................................... 349/158; 349/153

(58) Field of Classification Search
CPC .............. G02F 1/1339; G02F 2201/50; G02F 2201/54; C23C 16/45525; H01L 51/5237
USPC .............. 349/122, 58, 60, 155, 153, 158, 190; 156/280
See application file for complete search history.

(56) References Cited

U.S. PATENT DOCUMENTS

| 4,389,973 | A  | 6/1983  | Suntola et al. |
|-----------|----|---------|----------------|
| 4,413,022 | A  | 11/1983 | Suntola et al. |
| 2001/0050372 | A1 | 12/2001 | Krijn et al. |
| 2003/0143319 | A1 | 7/2003 | Park et al. |
| 2004/0197476 | A1 | 10/2004 | Skarp et al. |

(Continued)

FOREIGN PATENT DOCUMENTS

| WO | WO 2004/105149 A1 | 12/2004 |
|----|-------------------|---------|
| WO | WO 2009/071741 A1 | 6/2009  |

OTHER PUBLICATIONS

International Search Report for corresponding International Patent Application No. PCT/FI2011/050073 mailed Mar. 30, 2011.

(Continued)

*Primary Examiner* — Thanh-Nhan P Nguyen
(74) *Attorney, Agent, or Firm* — Merchant & Gould P.C.

(57) ABSTRACT

A strengthened structural module (2) and a method for fabricating a strengthened structural module (2). The module comprises an essentially planar glass substrate (1), an essentially planar second substrate (3), and at least one spacer element (5) in between the glass substrate (1) and the second substrate (3). The at least one spacer element (5) keeps the glass substrate (1) and the second substrate (3) separated from each other from the edges of the two substrates and defines a space (7) in between the two substrates in the inside of the module. The module comprises a coating (9) surrounding the module around the outside of the module. The coating (9) is arranged conformally on the surfaces facing the outside of the module, for increasing the strength of the module.

23 Claims, 3 Drawing Sheets

(56) References Cited

U.S. PATENT DOCUMENTS

Figure 1:
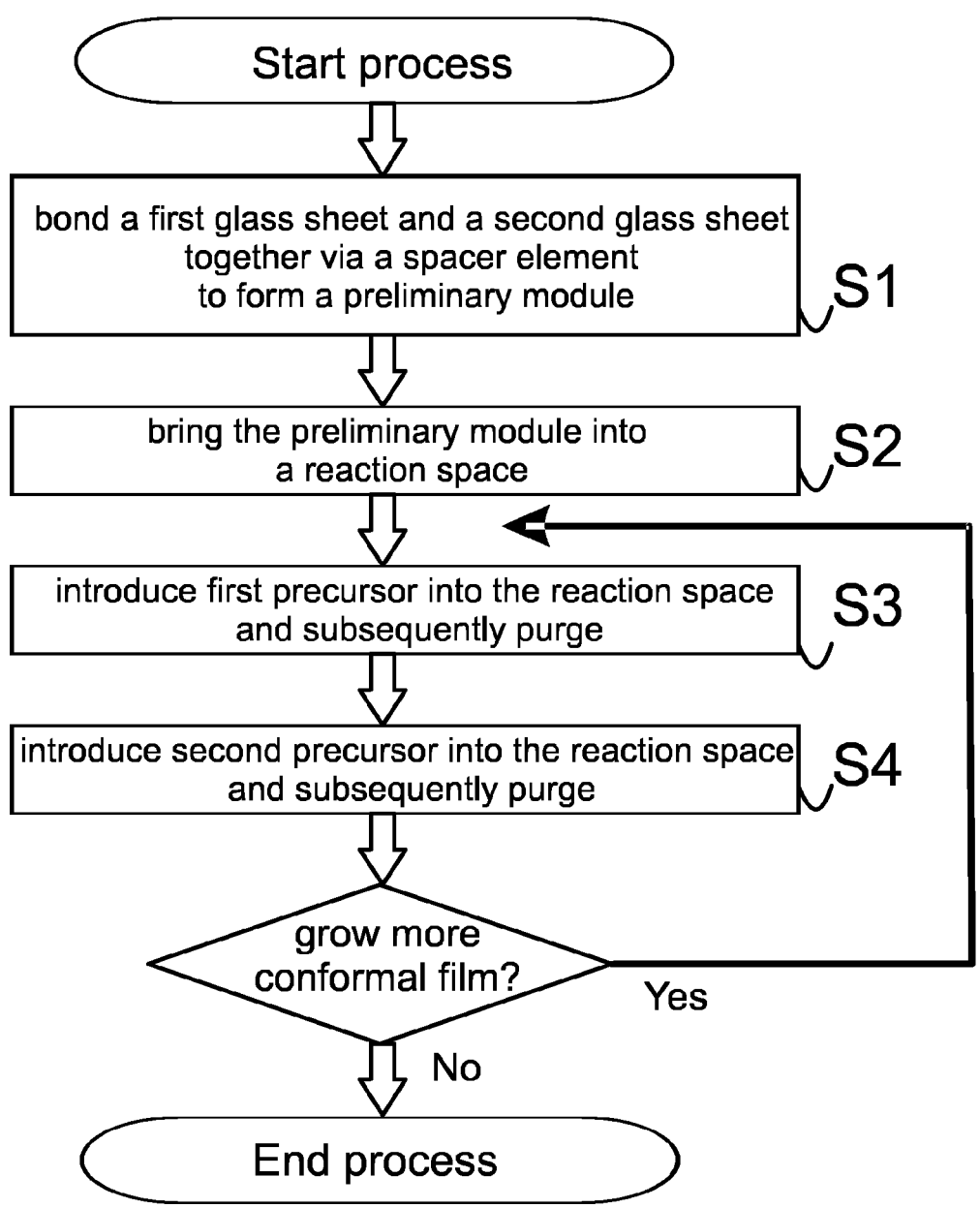

| | | |
|---|---|---|
| 2005/0193947 A1* | 9/2005 | Basceri .................... 118/715 |
| 2006/0284556 A1 | 12/2006 | Tremel et al. |
| 2008/0259268 A1* | 10/2008 | Nakajima et al. ............ 349/158 |
| 2009/0079328 A1 | 3/2009 | Fedorovskaya et al. |
| 2010/0052503 A1* | 3/2010 | Fukagawa .................... 313/483 |
| 2011/0043742 A1* | 2/2011 | Cavanaugh .................. 349/153 |
| 2011/0223710 A1* | 9/2011 | Beck ............................ 438/95 |

OTHER PUBLICATIONS

Finnish Search Report for corresponding Finnish Patent Application No. 20105096 mailed Nov. 5, 2010.

* cited by examiner a - a

STRENGTHENED STRUCTURAL MODULE AND METHOD OF FABRICATION

This application is a National Stage Application of PCT/FI2011/050073, filed 31 Jan. 2011, which claims benefit of Serial No. 20105096, filed 2 Feb. 2010 in Finland and which application(s) are incorporated herein by reference. To the extent appropriate, a claim of priority is made to each of the above disclosed applications.

FIELD OF THE INVENTION

The present invention relates to film deposition technology and to display technology. Especially the present invention relates to a module comprising a glass substrate, which module has been strengthened by a coating, and to a method for fabricating such a module.

BACKGROUND OF THE INVENTION

Many structural modules utilized in displays, especially in flat panel displays or touch panels, employ one or more sheets of glass for various purposes. A glass sheet can e.g. protect the pixel matrix which forms the image, or it can provide mechanical support for other functional layers e.g. in a display or in a touch panel. Simultaneously glass, as a material, provides for excellent optical properties, such as low absorption for visible light, which is mandatory for high quality displays and for touch panels on these displays.

When a layer of glass resides in between the viewer and the layer forming the image of a display, the layer of glass should be optically as uniform as possible so that the quality of the image is not compromised by the covering glass. To minimize optical flaws in one layer of glass it is common that only one structurally and optically homogeneous sheet of glass is employed for one layer of glass and no separate glass sheets are bonded together to form the layer. Therefore the size of such homogeneous glass sheets corresponds naturally to the size of the panel and the size of the sheet can vary from a couple of inches to even above 100 inches in diameter.

For improving the quality of the image and for reducing the weight of the panel, a glass sheet placed in front of the layer forming the image in a display is commonly very thin. As a result the glass sheets employed in panels suitable for displays may be mechanically weak and have a low threshold for rupture. For high quality and low weight displays it is therefore important to be able to fabricate structural modules incorporating a glass sheet, such that the threshold of fracture, or other parameters corresponding to strength, of the glass sheet upon environmental disturbances is increased in the module.

The prior art describes different structural modules for displays which incorporate glass substrates, commonly thin sheets of glass. Some of these modules attempt to e.g. improve the mechanical robustness and other mechanical properties of the structure by specific designs. For example patent application publication US2001/0050372 discloses a flexible substrate comprising a glass sheet having a layer of synthetic resin material in its surface.

With the ever increasing size of displays, now more than ever there exists a strong need for structural modules incorporating glass substrates with higher strength and mechanical robustness for displays.

Purpose of the Invention

A purpose of the present invention is to solve the aforementioned technical problems of the prior-art by providing new types of strengthened structural modules which comprise a glass substrate.

SUMMARY OF THE INVENTION

The structure and the method according to the present invention are characterized by what is presented in the claims.

A strengthened structural module according to the present invention comprises an essentially planar glass substrate, an essentially planar second substrate, and at least one spacer element in between the glass substrate and the second substrate and in contact with the planar surface of the glass substrate and the planar surface of the second substrate. The at least one spacer element keeps the glass substrate and the second substrate separated from each other from the edges of the two substrates and defines a space in between the two substrates in the inside of the module. The module comprises a coating surrounding the module around the outside of the module, the coating being arranged conformally on the glass substrate, on the second substrate and on the at least one spacer element, on the surfaces facing the outside of the module, for increasing the strength of the module.

According to the present invention a method for fabricating a strengthened structural module comprising an essentially planar glass substrate, an essentially planar second substrate, and at least one spacer element, comprises, arranging the at least one spacer element in between the essentially planar glass substrate and the essentially planar second substrate in contact with the planar surface of the glass substrate and the planar surface of the second substrate. The at least one spacer element keeps the glass substrate and the second substrate separated from each other from the edges of the two substrates and defines a space in between the two substrates in the inside of the module. The method comprises forming a coating surrounding the module around the outside of the module conformally on the glass substrate, on the second substrate and on the at least one spacer element, on the surfaces facing the outside of the module, for increasing the strength of the module.

In this specification, unless otherwise stated, the expression "conformal" or any similar expression in the context of a coating should be understood as a coating whose thickness is essentially the same at each point of the coating and whose surface profile follows the features of surface of the underlying substrate.

In this specification, unless otherwise stated, the expression "planar" or any similar expression in the context of a substrate should be understood as a plane-like substrate, whose two lateral dimensions are much bigger than the thickness of the substrate. Hence a planar substrate can be e.g. a slightly curved sheet.

It was surprisingly observed that by forming a conformal coating surrounding the module around the outside of the module the strength of the module was significantly increased. The increased strength was observed by measuring increases in the flexural strength and in the Weibull modulus both for the glass substrate of the module as well as for the complete module. The applied conformal coating also improved sealing of the structural module such that diffusion of gas into the space in between the two substrates in the inside of the module was reduced.

According to one embodiment of the invention the space in between the two substrates is a closed space. When the space in between the glass substrate and the second substrate is closed, functional coatings or other sensitive components within the space can be efficiently sealed off from the environment. This facilitates e.g. further processing and assembly of the module for its final application.

According to one embodiment of the invention the coating is a continuous thin-film. According to another embodiment of the invention the coating has a thickness of below 50 nanometers. It was surprisingly observed that even a very thin conformal coating in the form of a continuous thin-film was sufficient to result in significant strengthening of the module. Thin-films also possess economical advantages over thicker coatings e.g. in the form of smaller material consumption and shorter fabrication times.

According to one embodiment of the invention the second substrate is glass. When employing glass also as the second substrate the module can be made essentially transparent to visible light. This kind of structural module can be employed in liquid crystal displays. The transparent module can also placed entirely in front of a pixel matrix in a display, which brings versatility to the module and enables it to be used e.g. for haptic interfaces (touch sensitive panels) on a display.

According to one embodiment of the invention the method is used to fabricate a module for a display device. According to another embodiment of the invention the module of the present invention is used in a display device. According to another embodiment of the invention the module is a module in a flat panel display. According to yet another embodiment of the invention the space in between the two substrates comprises liquid crystals suitable for a liquid crystal display. The structural module of the present invention can easily accommodate different functional layers and other materials necessary for the operation of a flat panel display. The module is especially suitable for flat panel liquid crystal displays where the liquid crystals can be embedded and efficiently sealed off in the space within the module.

According to one embodiment of the invention the at least one spacer element seals the space to prevent gas flow from the outside of the module to the inside of the module. According to another embodiment of the invention the material of the spacer element is selected from the group consisting of epoxy resins, elastomers and glass frits. The epoxy resins can in some embodiments of the invention be thermo-set resins or photo-set resins.

According to one embodiment of the invention the essentially planar glass substrate is thinner than 1.5 millimeters on the average. When thin glass sheets with an average thickness of less than 1.5 mm were employed as the glass substrate in the structural module, the relative increase in the measured strength of the module as a result of the conformal coating surrounding the module was especially high.

According to one embodiment of the invention forming a coating comprises depositing a continuous film conformally on the surfaces facing the outside of the module. According to another embodiment of the invention forming the coating comprises introducing a first precursor into a reaction space, such that at least a portion of the first precursor adsorbs on the surfaces facing the outside of the module, and subsequently purging the reaction space; and introducing a second precursor into the reaction space, such that at least a portion of the second precursor reacts with the adsorbed portion of the first precursor, and subsequently purging the reaction space. According to yet another embodiment of the invention forming a coating comprises forming the coating with an Atomic Layer Deposition (ALD)-type process. By forming the conformal coating around the outside surfaces of the structural module by depositing a continuous film on the surfaces the strengthening effect of the module is further pronounced. Conformality is especially high and the strengthening effect is emphasized when the coating is a thin-film deposited onto the module with an ALD-type process, where the film grows primarily through essentially self-limiting surface reactions. Excellent conformality of the coating and strengthening of the module are obtained also with any other process based on alternately introducing precursors into a reaction space such that at least a portion of the introduced precursors adsorb onto the outside surfaces of the module.

The embodiments of the invention described hereinbefore may be used in any combination with each other. Several of the embodiments may be combined together to form a further embodiment of the invention. A structure or a method, to which the invention is related, may comprise at least one of the embodiments of the invention described hereinbefore.

DETAILED DESCRIPTION OF THE INVENTION

Figure 2A:
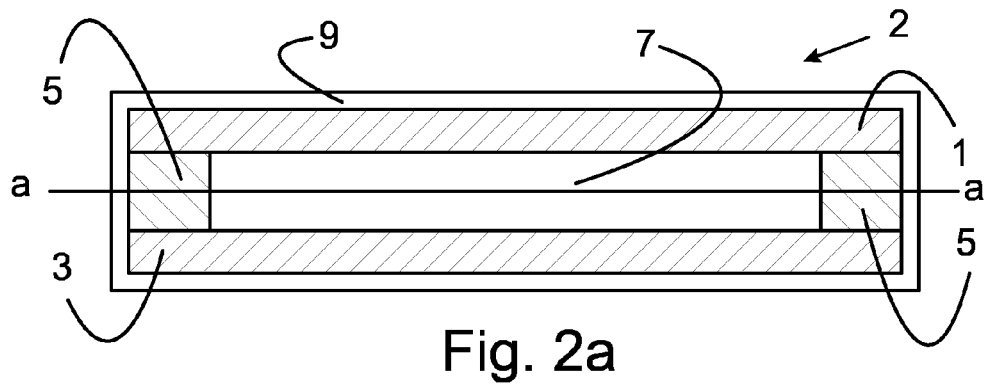
Figure 2B:
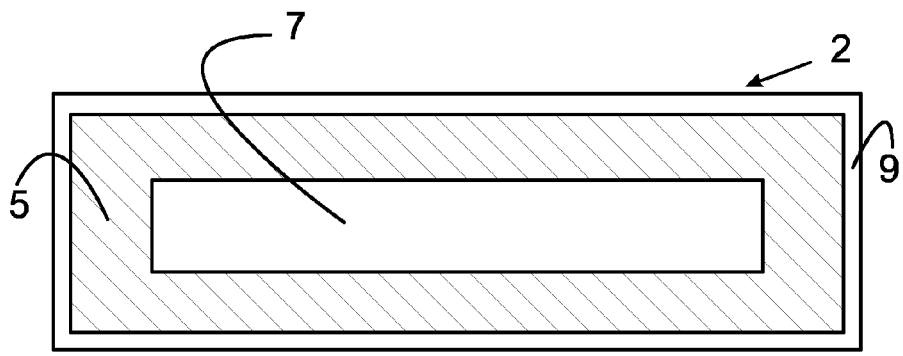

In the following, the present invention will be described in more detail with exemplary embodiments by referring to the accompanying figures, in which FIG. 1 is a flow-chart illustration of a method for fabricating a module of FIG. 2 according to one embodiment of the present invention, FIG. 2a is a schematic cross-section illustration of a module according to one embodiment of the present invention, FIG. 2b is a schematic cross-section of a module according to FIG. 2a viewed from a direction perpendicular to the plane of the planar structure.

Figure 3A:
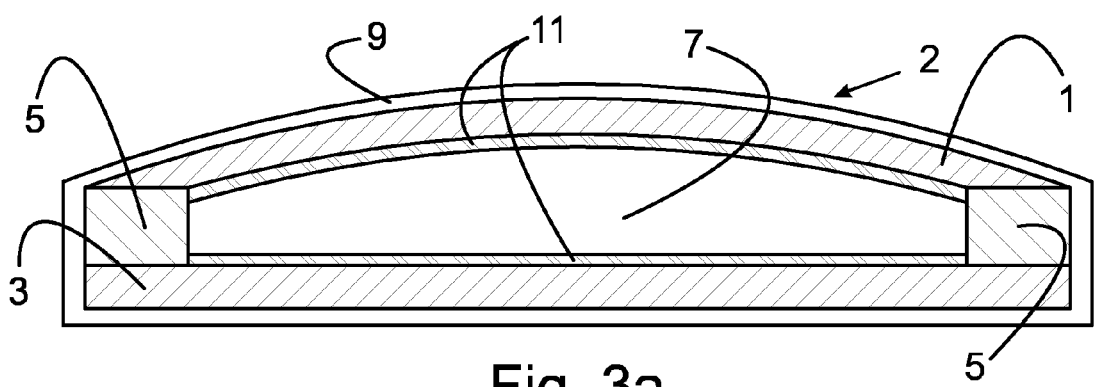
Figure 3B:
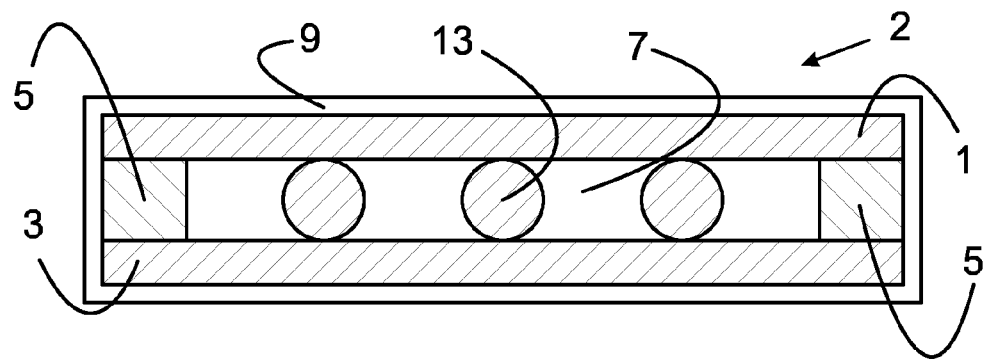
Figure 3C:
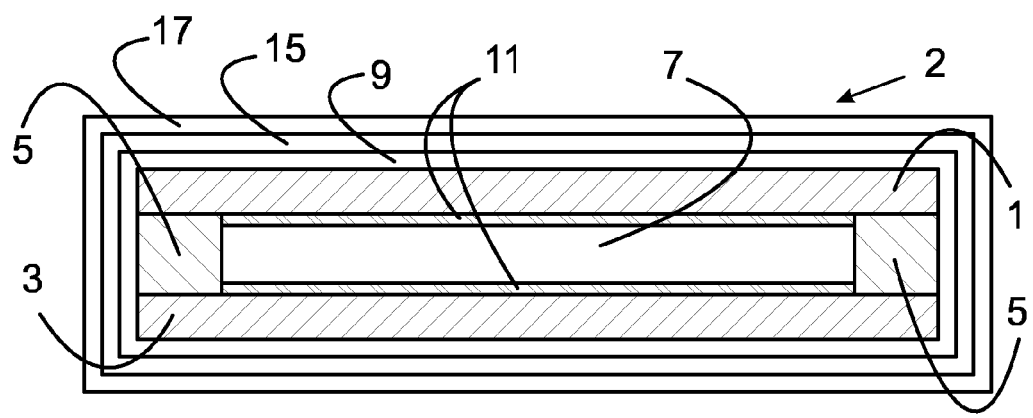

FIG. 3a is a schematic cross-section illustration of another module according to one embodiment of the present invention, FIG. 3b is a schematic cross-section illustration of another module according to one embodiment of the present invention, and FIG. 3c is a schematic cross-section illustration of yet another module according to one embodiment of the present invention.

For reasons of simplicity, item numbers will be maintained in the following exemplary embodiments in the case of repeating components.

The description below discloses some embodiments of the invention in such a detail that a person skilled in the art is able to utilize the invention based on the disclosure. Not all steps or components of the embodiments are discussed in detail, as many of the steps or components will be obvious to the person skilled in the art based on this specification.

The method of FIG. 1 starts with step S1 in which two glass sheets 1, 3 are bonded together via a spacer element 5 in between the two sheets 1, 3. The spacer element 5 separates the two glass sheets 1, 3 such that a closed space 7 is formed in between the glass sheets 1, 3. The resulting structure, which is hereinafter referred to as a preliminary module resembles the structural module 2 schematically illustrated in FIG. 2a and FIG. 2b without the conformal coating 9 surrounding the preliminary module. In the method of FIG. 1 the conformal coating 9 is deposited all around the preliminary module as a continuous film surrounding the surfaces facing the outside of the module, including the top, the bottom and the sides of the module.

The deposition process for the conformal coating 9 begins by bringing the preliminary module into a reaction space (step S2). After the preliminary module and the reaction space have reached a targeted deposition temperature and other conditions suitable for deposition, an alternate exposure of the surfaces of the module to different precursors is started, to deposit a conformal and continuous thin-film around the preliminary module with an ALD-type deposition method.

Atomic Layer Deposition (ALD), or an ALD-type method, is a method for depositing uniform and conformal films, e.g. thin-films, over substrates of various shapes, even over complex 3D (three dimensional) structures. In ALD-type methods the deposit is grown by alternately repeating, essentially self-limiting, surface reactions between a precursor and a surface to be coated. Therefore the growth mechanism in an ALD-type process is commonly not as sensitive as in many other coating methods to e.g. the flow dynamics inside a reaction chamber.

In an ALD-type process two or more different chemicals (precursors) are introduced to a reaction space in a sequential, alternating, manner and the precursors adsorb on surfaces, e.g. on a substrate, inside the reaction space. The sequential, alternating, introduction of precursors is commonly called pulsing (of precursors). In between each precursor pulse there is a purging period during which a flow of gas which does not react with the precursors used in the process is introduced through the reaction space. This gas, often called the carrier gas, is therefore inert towards the precursors used in the process and purges the reaction space from e.g. surplus precursor and by-products resulting from the adsorption reactions of the previous precursor pulse. This purging can be arranged also by other means. The essential feature of the ALD-type methods is to sequentially expose the deposition surface to precursors and to growth reactions of precursors essentially on the deposition surface.

A film can be grown by an ALD-type process by repeating several times a pulsing sequence comprising the aforementioned pulses containing the precursor material, and the purging periods. The number of how many times this sequence, called the "ALD cycle", is repeated depends on the targeted thickness of the film, or coating.

The prior art discloses a wide range of materials that can be synthesized and deposited on a substrate by alternately exposing the surface of the substrate to different precursors, in an ALD-type process. Also many different apparatuses suitable for carrying out an ALD-type process are disclosed in the prior art. For example U.S. Pat. No. 6,174,377 describes deposition tools for ALD. A good review about the basics of ALD in general is the book; *Atomic Layer Epitaxy*, by T. Suntola et al., Blackie and Son Ltd., Glasgow, 1990.

The construction of a processing tool suitable for carrying out the methods in the following embodiments will be obvious to the skilled person in light of this disclosure. The tool can be e.g. a conventional ALD tool suitable for handling the process chemicals. ALD tools (i.e. reactors) are disclosed in e.g. U.S. Pat. No. 4,389,973 and U.S. Pat. No. 4,413,022 which are included herein as references. Many of the steps related to handling such tools, such as delivering a substrate into the reaction space, pumping the reaction space down to a low pressure, or adjusting gas flows in the tool if the process is done at atmospheric pressure, heating the substrates and the reaction space etc., will be obvious to the skilled person.

The precursors in an ALD-type process are suitably introduced into the reaction space in their gaseous form. This can be realized by first evaporating the precursors in their respective source containers which may or may not be heated depending on the properties of the precursor chemical itself. The evaporated precursor can be delivered into the reaction space by e.g. dosing it through the pipework of the reactor tool comprising flow channels for delivering the vaporized precursors into the reaction space. Controlled dosing of vapor into the reaction space can be realized by valves installed in the flow channels or other flow controllers. These valves are commonly called pulsing valves in a system suitable for ALD-type deposition. Also other mechanisms of bringing the substrate into contact with a chemical inside the reaction space may be conceived. One alternative is to make the surface of the substrate (instead of the vaporized chemical) move inside the reaction space such that the substrate moves through a region occupied by a gaseous chemical.

A typical reactor suitable for ALD-type deposition comprises a system for introducing carrier gas, such as nitrogen or argon into the reaction space such that the reaction space can be purged from surplus chemical and reaction by-products before introducing the next chemical into the reaction space. This feature together with the controlled dosing of vaporized precursors enables alternately exposing the surface of a substrate to precursors without significant intermixing of different precursors in the reaction space or in other parts of the reactor. In practice the flow of carrier gas is commonly continuous through the reaction space throughout the deposition process and only the various precursors are alternately introduced to the reaction space with the carrier gas. Obviously, purging of the reaction space does not necessarily result in complete elimination of surplus precursors or reaction by-products from the reaction space but residues of these or other materials may always be present.

After the preliminary module has been prepared and brought into the reactions space (steps S1 and S2 discussed above), in the embodiment of the present invention shown in FIG. 1, the ALD-type growth of a film begins by step S3; i.e. the surfaces of the preliminary module facing the outside of the module are exposed to the first precursor such as water. Exposure of the surfaces to the first precursor results, in suitable process conditions discussed below, in the adsorption of a portion of the introduced precursor onto the exposed surfaces. After purging of the reaction space, the surfaces are exposed to a second precursor (step S4), which in this case can be e.g. trimethylaluminum (TMA). Subsequently, the reaction space is naturally purged again. Some of this second precursor in turn gets adsorbed onto the surface resulting from step S3.

Step S3 followed by step S4 results in the essentially conformal formation of deposit around all the exposed surfaces, i.e. on the surfaces facing the outside, of the preliminary module. Each exposure of the deposition surface to a precursor in steps S3 or S4, according to the embodiment of FIG. 1, results in the formation of additional deposit on the deposition surfaces as a result of adsorption reactions of the corresponding precursor with the surface. Hence, eventually steps S3 and S4, when repeated sufficiently many times, result in the formation of a continuous and conformal coating 9 around the preliminary module. The number of how many times the steps S3 and S4 should be repeated heavily depends on the process chemistry (on the precursors), and even a single ALD-cycle may be enough to form a continuous and conformal thin-film 9 around the preliminary module.

Thickness of the conformal coating 9 on the preliminary module can be increased by repeating the steps S3 and S4 in this order, as presented by the flow-chart of FIG. 1. The thickness of the conformal coating 9 is increased until a targeted thickness is reached, after which the alternate exposures are stopped and the process is ended. Finally the method of FIG. 1 results in the strengthened structural module 2 of FIG. 2a and FIG. 2b according to one embodiment of the present invention.

As a result of the deposition process a conformal and continuous thin-film is formed on the surface of the preliminary module. This conformal coating 9 provides for the significant strengthening of the module 2, as discussed above.

The conformal coating 9 also possesses excellent thickness uniformity and compositional uniformity around the surface of the module 2. An additional advantage of a film grown by an ALD-type process is that the good conformality and high density of the film enhance sealing of the closed space 7 within the module.

The strengthened structural module 2 can be used in many ways as it can incorporate many different functional components making it suitable for e.g. different types of plat panel displays and/or touch sensitive panels for touch screens. FIGS. 3a-3c schematically illustrate different embodiments of the strengthened structural module 2 of the present invention. The embodiments incorporate various functional elements in the space 7 of the strengthened structural module 2.

The strengthened structural module 2 of FIG. 3a includes transparent electrodes 11 on the glass substrate 1 and on the second substrate 3, each on the surface facing the inside (the space 7) of the module 2. The essentially planar glass substrate 1 is slightly curved in this embodiment. This kind of structural module 2 can be employed in e.g. resistive touch panels where also the second substrate 3 is transparent. In some other embodiments of the present invention the second substrate 3 can be opaque, e.g. a metallic foil.

The strengthened structural module 2 of FIG. 3b incorporates additional spacers 13 in the space 7 to ensure that the glass substrate and the second substrate retain a specific distance between each other upon possible external disturbances. This is useful for example in applications where the space 7 houses sensitive components such as liquid crystals. Indeed, the structural module of FIG. 3b is suitable for example for liquid crystal displays, in which case the second substrate 3 is commonly a glass sheet or a sheet of other transparent material e.g. polymer.

The strengthened structural module 2 of FIG. 3c includes transparent electrodes 11 on the glass substrate 1 and on the second substrate 3 on the surface facing the inside (the space 7) of the module 2. The module of FIG. 3c further comprises additional conformal coatings 15, 17 on the conformal coating 9 deposited on the surfaces facing the outside of the module. Additional conformal coatings can be employed e.g. to improve sealing of the space 7 from the environment.

The conformal coating 9 can be deposited by any method capable of forming a conformal film on the preliminary module. In addition to ALD, which produces films that are conformal even in the nanometer scale, other coating methods such as sputtering, chemical vapor deposition (CVD), sol-gel, dip coating, pulsed laser deposition (PLD) or SILAR (Successive Ionic Layer Adsorption and Reaction) can be utilized.

By suitably choosing the deposition method, the precursors and the process parameters utilized to form the conformal coating, the conformality and the homogeneity of the coating around the module can be further improved. The following example describes in detail how the conformal coating can suitably be grown on the preliminary module.

Example

Conformal coatings were formed on the surface of preliminary modules. The preliminary modules were structures where two glass sheets, each having a thickness of 300 micrometers, were separated by a sealing spacer element from the edges. The sheets were bonded together via the spacer element in between the two sheets. The substrates were like the structures schematically shown in FIG. 2 without the conformal coating 9 surrounding the module. These substrates were first inserted inside the reaction space of a P400 ALD batch tool (available from Beneq OY, Finland). The substrates were positioned inside the reaction space such that virtually the entire outer surface of the module was exposed to the reaction environment, and only a few small fixture points supported each module.

After preparations for loading the preliminary modules into the ALD tool, the reaction space of the ALD tool was pumped down to underpressure and a continuous flow of carrier gas was set to achieve the processing pressure of about 1 mbar (1 hPa) and the substrates were subsequently heated to the processing temperature. The temperature was stabilized to the processing temperature of 185° C. inside the reaction space by a computer controlled heating period of six hours. In this example the carrier gas discussed above, and responsible for purging the reaction space, was nitrogen ($N_2$). The processing temperature was sufficient to result in a thermally activated ALD-type growth and no plasma activation was employed in this example.

After the processing temperature was reached and stabilized, the first precursor was introduced to the reaction space according to step S3 of FIG. 1, to expose the surface of the preliminary module to the first precursor. After letting the carrier gas purge the reaction space from surplus first precursor and reaction byproducts, the resulting surface of the substrate was similarly exposed to the second precursor in step S4. After this, the reaction space was purged again. This pulsing sequence consisting of steps S3 and step S4 was carried out once and then repeated 199 times. After this the process was ended and the modules were ejected from the reaction space and from the ALD tool.

Exposure of the surface of the substrate to a specific precursor was carried out by switching on the pulsing valve of the P400 ALD tool controlling the flow of the precursor chemicals into the reaction space. Purging of the reaction space was carried out by closing the valves controlling the flow of precursors into the reaction space, and thereby letting only the continuous flow of carrier gas flow through the reaction space. The pulsing sequence in this example was in detail as follows; 0.6 s exposure to water, 1.5 s purge, 0.4 s exposure to trimethylaluminum, 2.0 s purge. An exposure time and a purge time in this sequence signify a time a specific pulsing valve for a specific precursor was kept open and a time all the pulsing valves for precursors were kept closed, respectively.

The 200 "ALD cycles" resulted in a conformal film of aluminum oxide with a thickness of approximately 20 nanometers (nm). This film was measured to be very conformal and uniform over large surface areas. After the coating process the strengthened structural modules showed a 35% increase in the flexural breaking strength while a dramatic 70% increase in the Weibull modulus was observed, compared to an otherwise identical uncoated preliminary module.

Similar tests as the one described in detail in the example above were also carried out with other deposition temperatures and with other film thicknesses. In these tests the coating thickness was varied between 15 nm and 50 nm, and the deposition temperature was varied between 100° C. and 200° C. All of the resulting coated modules showed significant strengthening in terms of the flexural breaking strength and the Weibull modulus.

In the examples above the first precursor is water and the second precursor is trimethylaluminum $Al_2(CH_3)_6$, but other precursors can also be used. The invention is not limited to using the aforementioned precursors or the ALD-method in particular and the advantages of the invention can be obtained by the skilled person in light of this specification also with other precursors and with other coating methods capable of producing conformal coatings around a substrate.

As is clear for a person skilled in the art, the invention is not limited to the examples described above but the embodiments can freely vary within the scope of the claims.

The invention claimed is:

1. A strengthened structural module comprising an essentially planar glass substrate, an essentially planar second substrate, and at least one spacer element in between the essentially planar glass substrate and the essentially planar second substrate and in contact with a planar surface of the essentially planar glass substrate and a planar surface of the essentially planar second substrate, the at least one spacer element keeping the essentially planar glass substrate and the essentially planar second substrate separated from each other from edges of the essentially planar glass substrate and the essentially planar second substrate, the at least one spacer element defining a space in between the essentially planar glass substrate and the essentially planar second substrate in an inside of the strengthened structural module, wherein the strengthened structural module comprises a coating having a thickness of less than 50 nanometers, the coating surrounding the strengthened structural module around an outside of the strengthened structural module, the coating being arranged conformally on the essentially planar glass substrate, on the essentially planar second substrate, on the at least one spacer element, and on surfaces facing the outside of the strengthened structural module, for increasing strength of the strengthened structural module.

2. The module of claim 1, the space in between the essentially planar glass substrate and the essentially planar second substrate is a closed space.

3. The module of claim 1, wherein the coating is a continuous thin-film.

4. The module of claim 1, wherein the essentially planar second substrate is glass.

5. The module of claim 1, wherein the strengthened structural module is provided for a flat panel display.

6. The module of claim 1, wherein the space in between the essentially planar glass substrate and the essentially planar second substrate comprises liquid crystals suitable for a liquid crystal display.

7. The module of claim 1, wherein the at least one spacer element seals the space to prevent gas flow from the outside of the strengthened structural module to the inside of the strengthened structural module.

8. The module of claim 1, wherein material of the at least one spacer element is selected from the group consisting of epoxy resins, elastomers and glass frits.

9. The module of claim 1, wherein the essentially planar glass substrate is thinner than 1.5 millimeters on average.

10. The module of claim 1, wherein the strengthened structural module is provided for a display device.

11. A method for fabricating a strengthened structural module comprising an essentially planar glass substrate, an essentially planar second substrate, and at least one spacer element, the method comprising: arranging the at least one spacer element in between the essentially planar glass substrate and the essentially planar second substrate in contact with a planar surface of the essentially planar glass substrate and a planar surface of the essentially planar second substrate, the at least one spacer element keeping the essentially planar glass substrate and the essentially planar second substrate separated from each other from edges of the essentially planar glass substrate and the essentially planar second substrate, the at least one spacer element defining a space in between the essentially planar glass substrate and the essentially planar second substrate in an inside of the strengthened structural module, wherein the method further comprises:

forming a coating having a thickness of less than 50 nanometers, the coating surrounding the strengthened structural module around an outside of the strengthened structural module, and applying the coating conformally on the essentially planar glass substrate, on the essentially planar second substrate, on the at least one spacer element, and on surfaces facing the outside of the strengthened structural module, for increasing strength of the strengthened structural module.

12. The method of claim 11, wherein the space in between the essentially planar glass substrate and the essentially planar second substrate is a closed space.

13. The method of claim 11, wherein the coating is a continuous thin-film.

14. The method of claim 11, wherein forming a coating comprises depositing a continuous film conformally on the surfaces facing the outside of the strengthened structural module.

15. The method of claim 11, wherein forming the coating comprises introducing a first precursor into a reaction space, such that at least a portion of the first precursor adsorbs on the surfaces facing the outside of the strengthened structural module, and subsequently purging the reaction space, and introducing a second precursor into the reaction space, such that at least a portion of the second precursor reacts with an adsorbed portion of the first precursor, and subsequently purging the reaction space.

16. The method of claim 11, wherein forming the coating comprises an Atomic Layer Deposition (ALD)-type process.

17. The method of claim 11, wherein the essentially planar second substrate is glass.

18. The method of claim 11, wherein the strengthened structural module is provided for a flat panel display.

19. The method of claim 11, wherein the space in between the essentially planar glass substrate and the essentially planar second substrate comprises liquid crystals suitable for a liquid crystal display.

20. The method of claim 11, wherein the at least one spacer element seals the space to prevent gas flow from the outside of the strengthened structural module to the inside of the strengthened structural module.

21. The method of claim 11, wherein material of the at least one spacer element is selected from the group consisting of epoxy resins, elastomers and glass frits.

22. The method of claim 11, wherein the essentially planar glass substrate is thinner than 1.5 millimeters on average.

23. The method of claim 11, wherein the method is used to fabricate a module for a display device.

* * * * *